United States Patent
Fujiwara (10) Patent No.: US 6,790,682 B2
(45) Date of Patent: Sep. 14, 2004

(54) DIE BONDER FOR DIE-BONDING A SEMICONDUCTOR CHIP TO LEAD FRAME AND METHOD OF PRODUCING A SEMICONDUCTOR DEVICE USING THE DIE BONDER

(75) Inventor: Susumu Fujiwara, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/199,015

(22) Filed: Jul. 22, 2002

(65) Prior Publication Data
US 2003/0024964 A1 Feb. 6, 2003

(30) Foreign Application Priority Data
Jul. 23, 2001 (JP) ........................................ 2001-221456

(51) Int. Cl.[7] .......................... H01L 21/00; B32B 31/00
(52) U.S. Cl. ........................................... 438/5; 156/378
(58) Field of Search ................................ 438/5, 14, 15; 156/60, 64, 349, 378, 379

(56) References Cited

U.S. PATENT DOCUMENTS 5,197,650 A * 3/1993 Monzen et al. ............... 228/6.2
5,256,578 A * 10/1993 Corley et al. ................... 437/8
5,851,848 A * 12/1998 Balamurugan ................ 438/33
6,021,380 A * 2/2000 Fredriksen et al. ........... 702/35
6,380,000 B1 * 4/2002 Subramanian ............... 438/113

FOREIGN PATENT DOCUMENTS

| JP | 1-227442 | 9/1989 |
| JP | 3-55855 | 3/1991 |
| JP | 5-308086 | 11/1993 |
| JP | 6-120265 | 4/1994 |

* cited by examiner

Primary Examiner—Ernest Karlsen
Assistant Examiner—Scott B. Geyer
(74) Attorney, Agent, or Firm—Birch, Stewart, Kolasch & Birch, LLP (57) ABSTRACT

To provide increased yields of semiconductor devices to achieve efficient production there are provided a storage correlating and storing inspection data of each of a plurality of semiconductor chips formed in a wafer and the position of each of a plurality of triac chips as seen on the wafer, a wafer screening portion referring to the inspection data of the semiconductor chips in the storage to select a wafer from a plurality of wafers, and a die-bonding portion die-bonding a triac chip formed in the selected wafer to a lead frame of a high rank semiconductor device having a superior characteristic.

16 Claims, 9 Drawing Sheets

DIE BONDER FOR DIE-BONDING A SEMICONDUCTOR CHIP TO LEAD FRAME AND METHOD OF PRODUCING A SEMICONDUCTOR DEVICE USING THE DIE BONDER

BACKGROUND OF THE INVENTION

1. Field of the Invention

The present invention relates generally to die bonders for die-bonding a semiconductor chip formed in a wafer to a lead frame and methods of producing a semiconductor device using the die bonder, and particularly to die bonders allowing increased yields of semiconductor devices and methods of producing a semiconductor device using the die bonder.

2. Description of the Background Art

Figure 10:
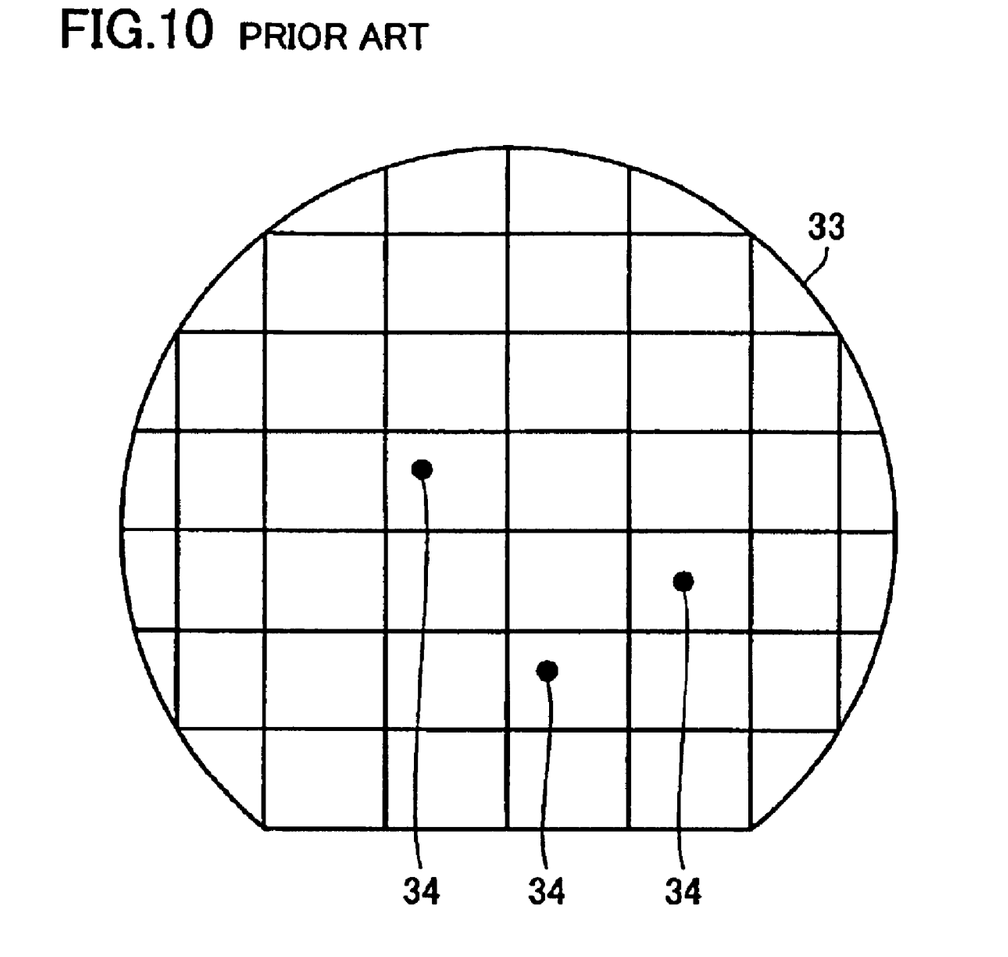
FIG. 10 shows an external appearance of a wafer marked with a bad mark.

FIG. 10 shows an appearance of a wafer marked with a bad mark. Conventionally, semiconductor chips formed in wafers are all tested by a tester apparatus wafer by wafer. Then, as shown in FIG. 10, any defective semiconductor chips are marked with a bad mark 34. Then a die bonder used to die-bond a semiconductor chip for example to a lead frame recognizes bad mark 34 on a wafer to determine whether the chip passes or fails. Only conforming semiconductor chips are thus selected and die-bonded to the lead frame.

Whether a semiconductor chip passes or fails is determined from a value of a characteristic of the chip and the appearance of the chip. This decision is made by a tester conducting an electrical test and a tester conducting an appearance test and if the chip is defective it is marked by bad mark 34. Rather than using the appearance tester, a visual inspection may alternatively be conducted in another step and products thus found to be defective in appearance may be marked by bad mark 34 manually.

While semiconductor chips have different sizes, such as 1 mm square, 2 mm square, 3 mm square and 4 mm square, bad mark 34 has a size for example of approximately 0.5 to 0.6 mm φ to consider the tester's performance. If bad mark 34 is manually provided the mark would vary in size.

When a die bonder is used to detect bad mark 34 provided on a wafer, the wafer's surface condition, the size of bad mark 34 on the wafer, a reflection of light from the wafer, and the like vary for each lot of wafers. Accordingly to recognize a bad mark on a wafer a device included in the die bonder to recognize the bad mark needs to be adjusted for each lot of wafers, which is inefficient. Furthermore, the die bonder that has been adjusted still can be affected by a condition of a surface of a wafer and erroneously recognize a bad mark during production and a recognition error can thus be made.

Among semiconductor devices there are those called high rank products having a superior characteristic and those called ordinary products having a characteristic inferior to the high rank products. To produce a high rank product, a costly wafer corresponding to the high rank product needs to be used or a less costly wafer corresponding to an ordinary product having a characteristic wider in range than the high rank product is used to produce semiconductor devices and after the devices are completed only those having the characteristic corresponding to the high rank product need to be selected. The process using the costly wafer requires increased production cost and the process including screening semiconductor devices to select high rank products from provides reduced yields.

SUMMARY OF THE INVENTION

The present invention has been made to resolve the above disadvantages.

One object of the present invention is to provide a die bonder which can eliminate the necessity of marking a wafer with a bad mark and still provide increased yields of semiconductor devices having a superior characteristic (high rank products).

Another object of the present invention is to provide a semiconductor device production method which can eliminate the necessity of marking a wafer with a bad mark and still provide increased yields of semiconductor devices having a superior characteristic.

To achieve the above objects the present invention in one aspect provides a die bonder including: a storage storing inspection data of each of a plurality of semiconductor chips formed in a wafer and a position of each of the plurality of semiconductor chips as seen in the wafer, the inspection data being correlated with the position; a wafer screening portion referring to the inspection data of the semiconductor chips in the storage to screen a plurality of wafers to select a wafer; and a die-bonding portion die-bonding to a frame of a semiconductor device having a characteristic of a first level a semiconductor chip formed in a wafer selected by the wafer screening portion.

In accordance with the present invention semiconductor chip inspection data stored in the storage can be referred to to screen wafers and a semiconductor chip formed in a wafer thus selected can be die-bonded to a lead frame of a semiconductor device. This can eliminate the necessity of marking a wafer with a bad mark at the inspection step and requiring the die bonder to recognize the bad mark. Furthermore since a wafer selected in accordance with the semiconductor chip inspection data can be used to die-bond a semiconductor chip to a lead frame of a semiconductor device the die bonder can provide increased yields of semiconductor devices.

Preferably the wafer screening portion selects a wafer including no less than a prescribed number of semiconductor chips having the inspection data falling within a range of a first predetermined reference value.

In accordance with the present invention a wafer is selected when it includes no less than a prescribed number of chips having inspection data falling within the range of a first predetermined reference value. As a semiconductor device has a characteristic affected by a semiconductor chip to be mounted, selecting a wafer having no less than the prescribed number of chips having inspection data falling within the range of the first predetermined reference value allows the die bonder to produce from a single wafer at least a prescribed number of semiconductor devices having a characteristic having a value exceeding a predetermined value.

The present invention in another aspect provides a die bonder including: a storage storing inspection data of each of a plurality of semiconductor chips formed in a wafer and a position of each of the plurality of semiconductor chips as seen in the wafer, the inspection data being correlated with the position; a semiconductor chip screening portion referring to the inspection data of the semiconductor chips in the storage to screen a plurality of semiconductor chips to select a semiconductor chip; and a die-bonding portion die-bonding to a frame of a semiconductor device a semiconductor chip selected by the semiconductor chip screening portion.

In accordance with the present invention a semiconductor chip selected in accordance with inspection data can be die-bonded to a lead frame of a semiconductor device. As a semiconductor device has a characteristic affected by a semiconductor chip to be mounted, die-bonding a semiconductor chip selected in accordance with inspection data to a lead frame of a semiconductor device allows the die bonder to provide increased yields of semiconductor devices.

Preferably the semiconductor chip screening portion selects a semiconductor chip having the inspection data falling within a first range and the die-bonding portion die-bonds the selected semiconductor chip to a frame of a semiconductor device having a characteristic of a first level.

In accordance with the present invention a chip having inspection data falling within the first range can be selected and die-bonded to a frame of a semiconductor device having a characteristic of a first level. The die bonder can thus provide increased yields of semiconductor devices having the characteristic of the first level.

The present invention in still another aspect provides a method of producing a semiconductor device, including the steps of: inspecting each of a plurality of semiconductor chips formed in a wafer; correlating and storing inspection data obtained at the step of inspecting and a position of each of the semiconductor chips as seen on the wafer; screening the semiconductor chips in accordance with the stored inspection data of the semiconductor chips to select a semiconductor chip; and die-bonding the selected semiconductor chip to a frame of a semiconductor device.

In accordance with the present invention, before a semiconductor chip is die-bonded to a lead frame of a semiconductor device the chip can be inspected and inspection data thus obtained can be used to screen the chip. If the chip is selected it is die-bonded to a lead frame of a semiconductor device. As a semiconductor device has a characteristic affected by a semiconductor chip to be mounted, using the inspection data to select a semiconductor chip and die-bonding the selected chip to a lead frame of a semiconductor device allows the semiconductor device production method to provide increased yields of semiconductor devices.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter a semiconductor production apparatus of the present invention in an embodiment will be described. In the figures, like reference characters denote like components. In the following description, a semiconductor production apparatus of the present invention in one embodiment is used to produce a solid state relay (hereinafter referred to as a "SSR").

Figure 1:
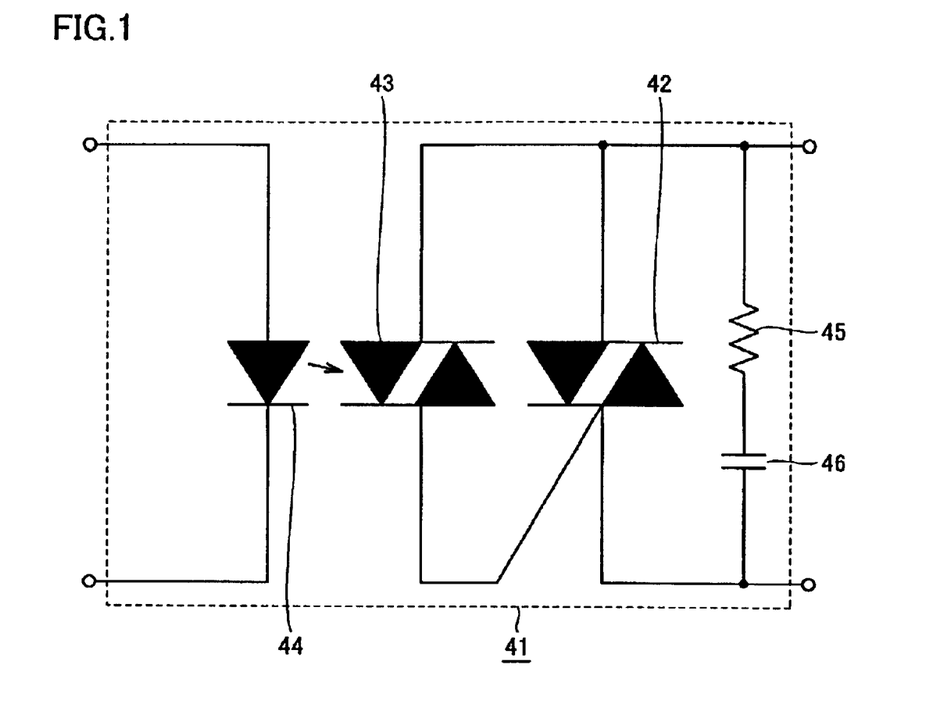
FIG. 1 is a circuit diagram of a solid state relay produced by a semiconductor production apparatus in one embodiment of the present invention.

As is well known, a solid state relay 41 includes a main triac 42, a phototriac 43, an infrared light emitting diode 44, a resistor 45 and a capacitor 46. Main triac 42, phototriac 43 and infrared light emitting diode 44 are each a semiconductor chip. Resistor 45 and capacitor 46 together form a snubber circuit. Infrared light emitting diode 44 is connected between input terminals. Main triac 42, phototriac 43, and the snubber circuit formed by resistor 45 and capacitor 46 are connected in parallel.

SSR 41 are generally produced, as follows: initially, main triac 42, phototriac 43 and infrared light emitting diode 44 are die-bonded on a lead frame (a die-bonding step). A wire of Au, Al or the like is then used to provide wire-bonding (a bonding step). Furthermore, resistor 45 and capacitor 46 are mounted and sealed with resin such as epoxy resin (a sealing step). A variety of tests are then conducted to screen products to separate them into conforming products and defective products (a finished-product testing step). Furthermore, in the testing step, conforming products are classified by characteristics items and thus ranked, divided into high rank products and ordinary products.

Main triacs are classified for example by magnitude in current into 1A–20 A classes. Depending on this classification a main triac varies in size. Furthermore there also exist semiconductor chips having their values in current falling within a single class that are ranked to be different types of semiconductor chips depending on the triac's repetitive peak-off voltage, gate trigger current, hold-current and other similar electrical characteristics.

Conventionally when the die-bonding step is introduced a bad mark on a wafer is the only information and it is thus impossible to rank semiconductor chips. Accordingly in a semiconductor device production process semiconductor chips are ranked at the finished-product testing step effected to determine whether they pass or fail. Accordingly, producing high rank products with semiconductor devices having a characteristic with a high value entails producing more semiconductor devices than scheduled while considering the yield thereof. Furthermore, as has been described above, semiconductor chips vary in size and if a bad mark of a single size is marked on a wafer the semiconductor chips having different sizes have different percentages in area occupied by the bad mark. Accordingly the die bonder is required to have a bad mark recognition device adjusted to accurately recognize the bad mark if chips formed on a wafer are different in size.

In order to address the above disadvantages the present invention provides before the die-bonding step a wafer testing step inspecting a semiconductor chip formed in a wafer. In this wafer testing step, a value of a characteristic of a semiconductor chip that is determined by the chip's production number is measured and the data of the measurement is correlated with the position of the chip, as seen on the wafer, and thus recorded for each wafer. Then at the die-bonding step the position of a semiconductor chip to be die-bonded is detected as seen on its wafer and the recorded data correlated with the position detected on the wafer is read. Then a criterion determined by their production numbers, types and the like is used to screen semiconductor chips. A combination of a plurality of chips thus selected is determined. The criterion is predetermined, correlated with product numbers of semiconductor chips and ranks of semiconductor devices to be produced (e.g., high rank product and normal product). The criterion is determined in range. It is determined for example as a repetitive peek-off voltage having a range of so and so V, a gate trigger current having a range of so and so mA, or a hold-current having a range of so and so mA. The criterion thus determined is used to allow the die bonder to determine which one of semiconductor chips formed in a wafer should used to produce a semiconductor device (SSR).

Figure 2:
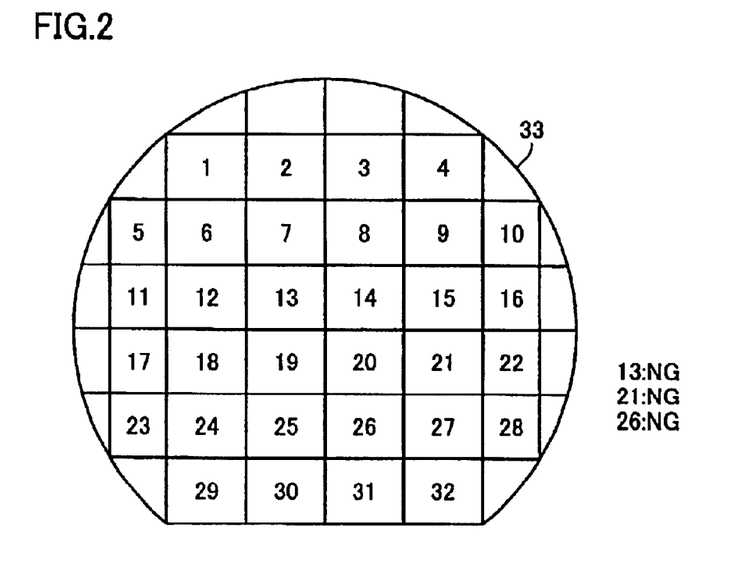
FIG. 2 schematically shows a wafer for illustrating a correlation between positional information of a triac chip on a wafer and inspection data of the triac chip.

FIG. 2 is a schematic view of a wafer for illustrating a correlation between positional information of a triac chip on a wafer and inspection data of the triac chip. With reference to FIG. 2, each triac chip on a wafer is assigned a number in relation to the chip's position on the wafer. A tester is then used to measure a value of a characteristic of the chip and the data of the measurement is correlated with the assigned number and stored to a storage. FIG. 2 shows a wafer 33 with triac chips assigned numbers 1–32. Then the fact that of chips 1–32, chips 13, 21 and 26 are no good (NG) products and the remaining chips are good products is stored to the storage. While the inspection data in this scenario is whether a product is an NG product or a good product, rather than a value of a characteristic, the data may be the exact value of the characteristic. In the following description, the inspection data corresponds to the exact value of the characteristic. In that scenario, the inspection data corresponding to the exact value of the characteristic is correlated with a number assigned a position on a wafer and thus stored.

Figure 3A:
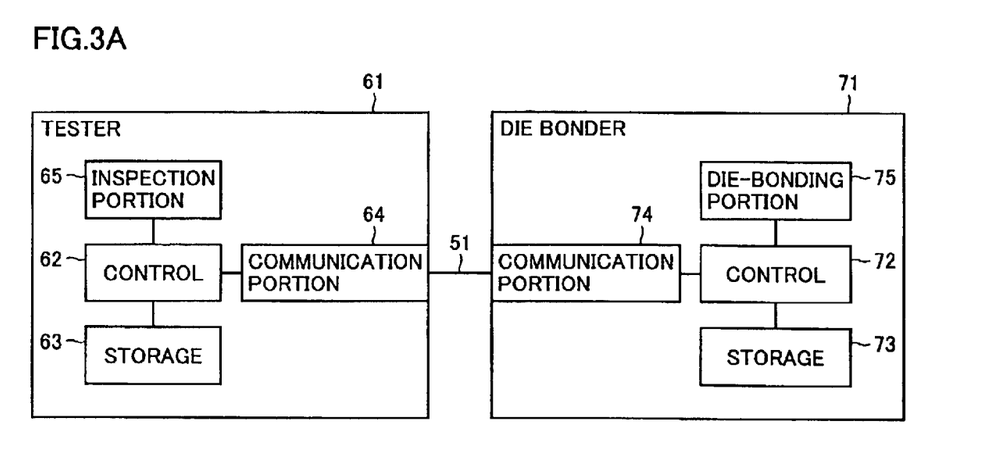
FIGS. 3A and 3B are block diagrams each generally showing a configuration of a SSR production apparatus in the present embodiment.
Figure 3B:
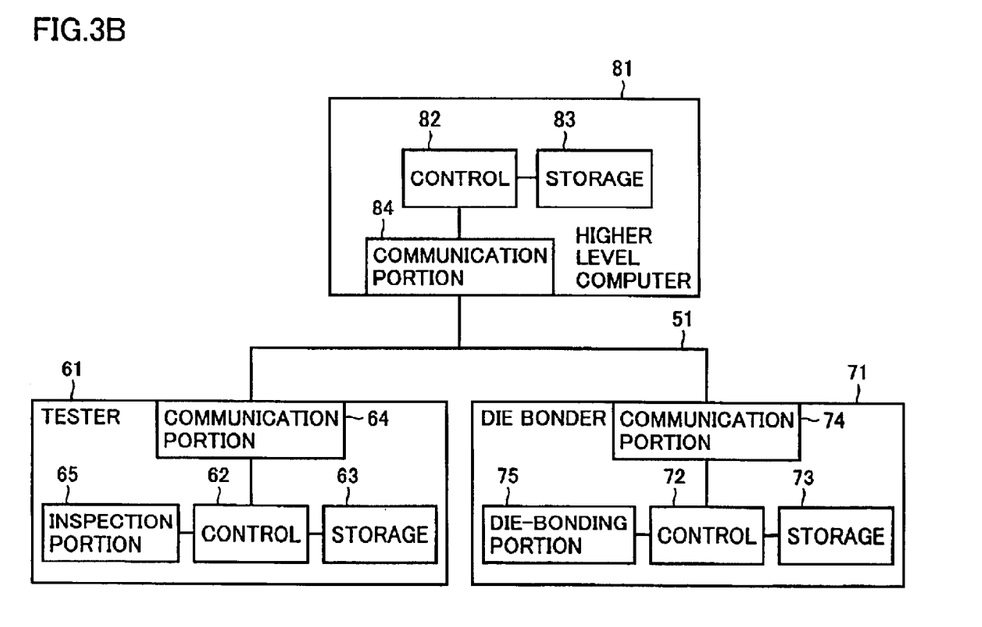

The positions of triac chips 1–32 as seen on the wafer and the inspection data obtained by measuring the chips are correlated and thus stored to a storage 63 (FIG. 3) of a tester. The stored positional information and inspection data are transmitted to a die bonder and stored therein at a storage 73 (FIG. 3). The positional information and inspection data correlated to the positional information that are stored in storage 73 are read when the die bonder die-bonds the chips. The chips are thus screened. This eliminates the necessity of the tester operating to mark a wafer with a bad mark.

Furthermore at the die-bonding step the die bonder receiving from the tester the positional information and the inspection data correlated to the positional information and using them to screen triac chips is no longer required to recognize the presence/absence of a bad mark on a wafer. Furthermore, it can use the inspection data correlated to the positional information to screen triac chips to select good chips and furthermore those having a characteristic having a higher value. As a value of a characteristic of a triac chip influences a characteristic of a SSR, selecting a chip having the characteristic of the higher value can contribute to increased yields of SSRs.

While a triac chip has been exemplified in the description, other semiconductor chips can also similarly be inspected and their data can be correlated with numbers assigned on positions on the wafer. The data can be stored and used by the die bonder to screen and die-bond the chips.

FIGS. 3A and 3B are block diagrams generally showing configurations of a SSR production apparatus in the present embodiment. As shown in FIG. 3A, a network 51 connects a tester 61 and a die bonder 71 together. Tester 61 includes a control 62 generally controlling tester 61, a storage 63 correlating and storing the position of a semiconductor chip on a wafer and inspection data of the chip, a communication portion 64 for communication with die bonder 71, and an inspection portion 65 inspecting a chip on a wafer to measure the value of a characteristic thereof.

Die bonder 71 includes a control 72 for generally controlling die bonder 71, a storage 73 receiving from tester 61 and storing the positional information of the chip on the wafer and the value of the characteristic of the chip correlated to the positional information, a communication portion 74 for communication with tester 61, and a die-bonding portion 75 for die-bonding to a lead frame a semiconductor chip formed in a wafer.

In tester 61 control 62 stores to storage 63 the inspection data of each semiconductor chip formed in a wafer that is obtained by inspection portion 65 measuring the chip. Control 62 transmits the inspection data stored in storage 63 to communication portion 64 and further transmits the data therefrom through network 51 to communication portion 74 of die bonder 71. The inspection data is data correlated to the position of the semiconductor chip on the wafer.

In die bonder 71 control 72 stores the received inspection data to storage 73. Then at the die-bonding step when the semiconductor chip is die-bonded to a lead frame control 72 refers to the received inspection data to determine whether the range of a prescribed screening criterion is satisfied and screen a wafer or a semiconductor chip to die-bond it.

Furthermore in the present embodiment the SSR production apparatus may be configured, as shown in FIG. 3B. Tester 61, die bonder 71, and a higher level computer 81 are connected together by network 51. Tester 61 and die bonder 71 are configured, as shown in FIG. 3A.

Higher level computer 81 includes a control 82 generally controlling higher level computer 81, a storage 83, and a communication portion 84 for communication with tester 61 or die bonder 71. In tester 61 control 62 transmits to communication portion 64 the inspection data of each semiconductor chip formed in a wafer that is obtained by inspection portion 65 measuring the chip, control 62 and further transmits the data on network 51 to higher level computer 81 directly. Before the inspection data is transmitted the data may temporarily be stored to storage 63. Note that the inspection data that is transmitted is data correlated to a position on a wafer.

In higher level computer 81 control 82 stores to storage 83 inspection data received at communication portion 84. Then in die bonder 71 control 72 in die-bonding requests higher level computer 81 via communication portion 74 and network 51 to transmit the inspection data. In this request, a wafer identification code for specifying a wafer is transmitted to allow higher level computer 81 to determine which wafer's inspection data should be transmitted.

In higher level computer 81 control 82 responds to the request from die bonder 71 by controlling communication portion 84 to transmit to die bonder 71 the inspection data stored in storage 83. In die bonder 71 when the inspection data is received control 72 stores the data to storage 73. The recorded inspection data is referred to to determine whether inspection data (a value of a characteristic) of a semiconductor chip formed in a wafer falls within the range of a prescribed screening criterion. In accordance with the decision, wafers are screened and thus selected to be die-bonded.

Tester 61 measures the value of a characteristic of each semiconductor chip formed in each of a plurality of wafers. Die bonder 71 in a wafer screening process screens wafers to select those having no less than a prescribed number of semiconductor chips having their respective inspection data falling within the range of a screening criterion.

Wafers that are screened out, i.e., those having less than the prescribed number of semiconductor chips falling within the range of the screening criterion may further be screened by a different, broader range of the screening criterion and die-bonded at the die-bonding step for example to produce ordinary semiconductor devices having a characteristic inferior to high rank products. Wafers can thus be used efficiently.

Figure 4:
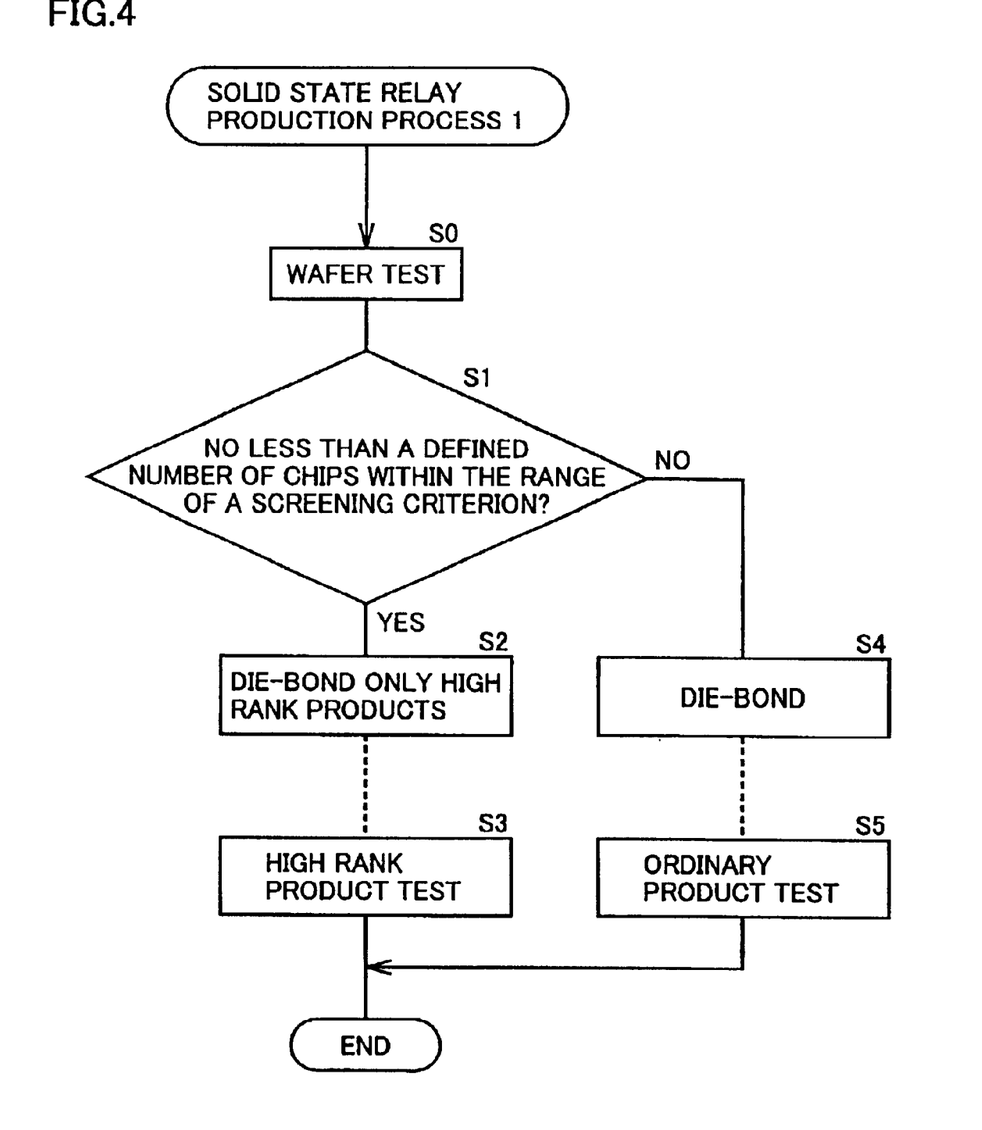
FIGS. 4, 7, 8 and 9 are flow charts for illustrating a process for producing a solid state relay.

Reference will now be made to flow charts to describe how wafers are screened, as described above, to produce a SSR. FIG. 4 is a first flow chart for illustrating a process for producing a solid state relay. With reference to FIG. 4, a semiconductor chip formed in a wafer is tested by tester 61 (S0) to measure the value of a characteristic of the chip, correlate the value as inspection data with the chip' position on the wafer, and thus stores them. Then in the die bonder a decision is made as to whether the wafer has no less than a prescribed number of semiconductor chips falling within the range of a screening criterion (S1). The prescribed number is a predetermined number. It should be noted that the prescribed number is a concept including a number obtained from a total number of semiconductor chips formed in a wafer and a predetermined proportion. If the wafer has no less than the prescribed number of semiconductor chips falling within the range of the screening criterion, the wafer is selected and supplied to a die-bonding step for high rank products (S2). A semiconductor chip is then die-bonded to a lead frame. The lead frame then undergoes a prescribed production process and is then subjected to a high rank product test (a finished-product test) (S3).

If at S1 a wafer has less than the prescribed number of semiconductor chips falling within the range of the screening criterion then the wafer is supplied to a die-bonding step for ordinary products (S4). After a prescribed production process an ordinary product test (a finished-product test) is conducted (S5).

Figure 5:
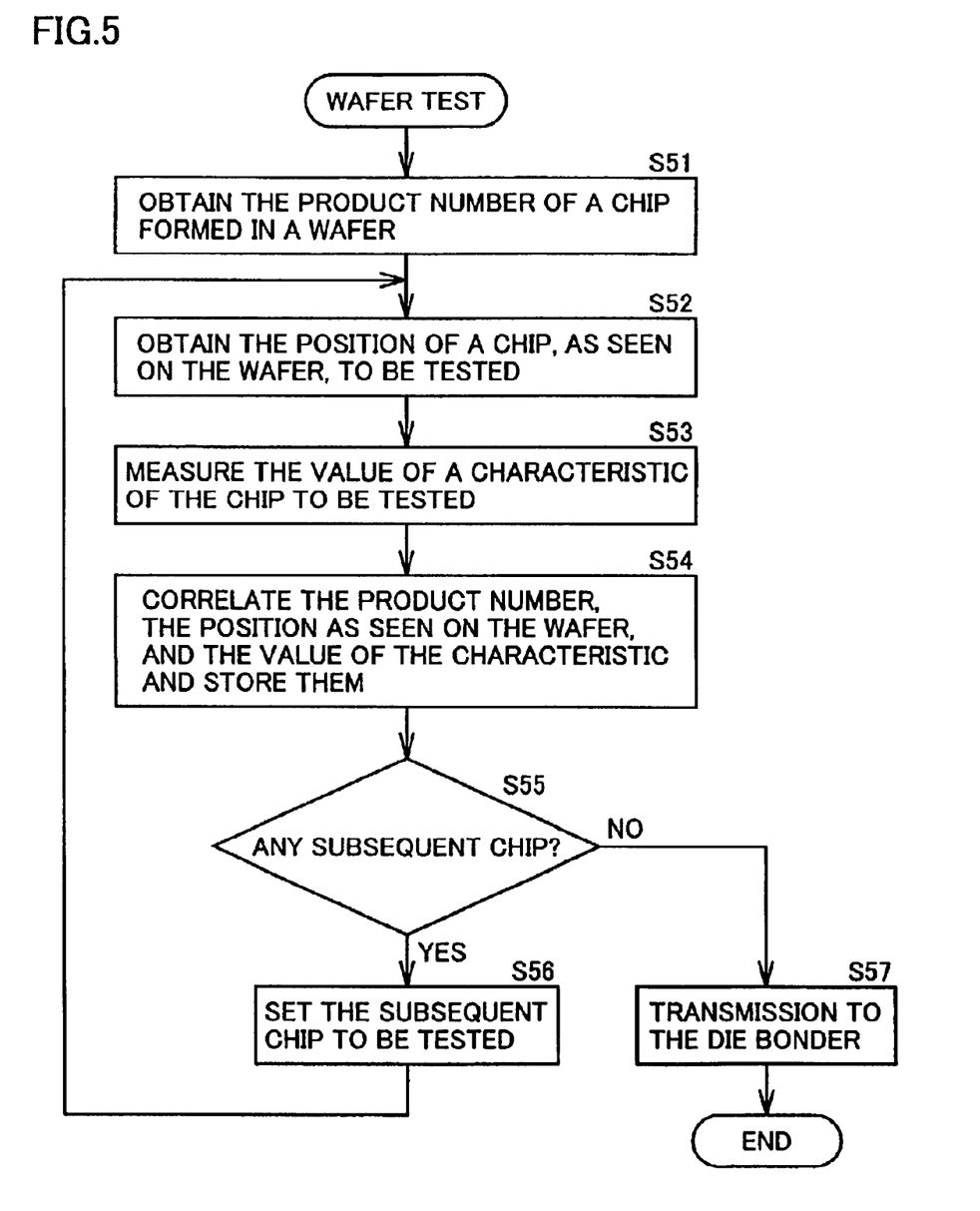
FIG. 5 is a flow chart representing a flow of a wafer testing process effected at the FIG. 4 step S0.

FIG. 5 is a flow chart representing a flow of a wafer testing process provided at the FIG. 4 step SO. The wafer testing process is provided by tester 61. With reference to FIG. 5, a wafer to be inspected is set in tester 61 and a product number of a chip formed in the wafer is obtained (S51). The product number is input by an operator of tester 61 via an input device such as a keyboard provided to tester 61. Alternatively, information of the chip's production number that has been written in the wafer itself may be read.

The position of a triac chip, as seen on the wafer, to be inspected is obtained (S52). As has been shown in FIG. 2, the wafer is previously divided into a plurality of regions one of which is determined as the chip's position on the wafer. Each region is previously assigned a number. Alternatively, positions on a wafer may be determined relative to a reference point previously provided to the wafer.

Inspection portion 65 then measures the value of a characteristic of a semiconductor chip to be inspected (S52).

The product number obtained at step S51, the positional information obtained at step S52 and the value of the characteristic measured (or inspection data obtained) at step S52 are correlated and stored to storage 63. Furthermore, if the chip is an NG product, information indicating that the chip is an NG product is also stored. The product number, the positional information and the value of the characteristic that are stored in storage 63 are correlated with a wafer identification code and stored to determine which wafer has the chip corresponding the data, and they are thus stored. At the subsequent step S55 a decision is made as to whether there exist any other semiconductor chips to subsequently be inspected. If so then the process proceeds with step S56 and if not then it proceeds with step 57.

At step S56 a semiconductor chip to subsequently be inspected is set as a chip to be inspected and the process returns to step S52.

At step S57 the chip's product number, position on its wafer, and inspection data recorded at step S54 in storage 63 are transmitted together with the wafer identification code through communication portion 64 and network 51 to die bonder 71. After step S57 the wafer testing process ends.

Note that while a wafer testing process provided in tester 61 is described, appearance test data obtained by an appearance tester is also similarly be stored as inspection data together with the chip's production number and position on a wafer and the wafer's identification code to a storage provided to the appearance tester and it is transmitted on network 51 to die bonder 71.

Furthermore, the chip's product number, positional information and inspection data stored in storage 63, as described above, may be transmitted to die bonder 71 via higher level computer 81. In doing so, at step S57 the chip's production number, positional information and inspection data stored at step S54 to storage 63 are transmitted together with the wafer's identification code via communication portion 64 and network 51 to higher level computer 81.

Thus each triac chip formed in a wafer has its value of a characteristic measured. The measurement provides inspection data, which is then correlated with the chip's production number and position on the wafer and stored to storage 63. The stored data are transmitted to die bonder 71. Thus in die bonder 71 when a wafer is identified by an identification code the data received from tester 61 can be used to obtain the inspection data of all of the semiconductor chips on the wafer.

Figure 6:
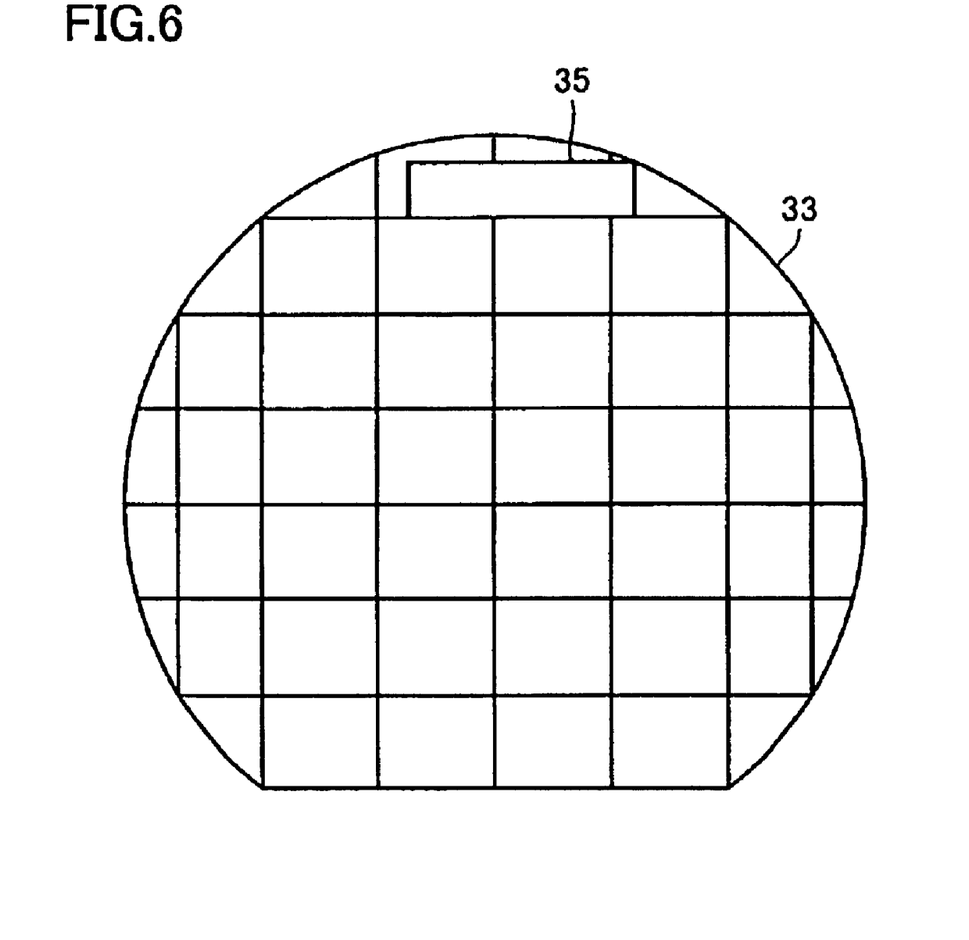
FIG. 6 shows an external appearance of a wafer marked with an identification mark.

Wafers can be screened simply by an identification mark provided on each wafer and including the wafer's identification code. FIG. 6 shows an external appearance of a wafer marked with an identification mark. As shown in FIG. 6, in a wafer production process or a wafer test process a bar code or any other similar identification mark is printed directly on wafer 33 or an identification mark printed for example on a sheet of paper is stuck on wafer 33.

Rather than the identification mark, a wafer identifying chip may be provided on a wafer at a specific position to record the wafer's identification code. To do so, reading and writing the identification code from and to the wafer identifying chip requires a separate device which reads and writes the wafer identification code. The wafer identification code can thus help to correlate a wafer and inspection data of a triac chip formed in the wafer. As such, if triac chips are produced in a factory and they are die-bonded in another factory and wafers accordingly need to be transferred from one place to another, wafers and inspection data of triac chips formed on the wafers can be correlated.

Figure 7:
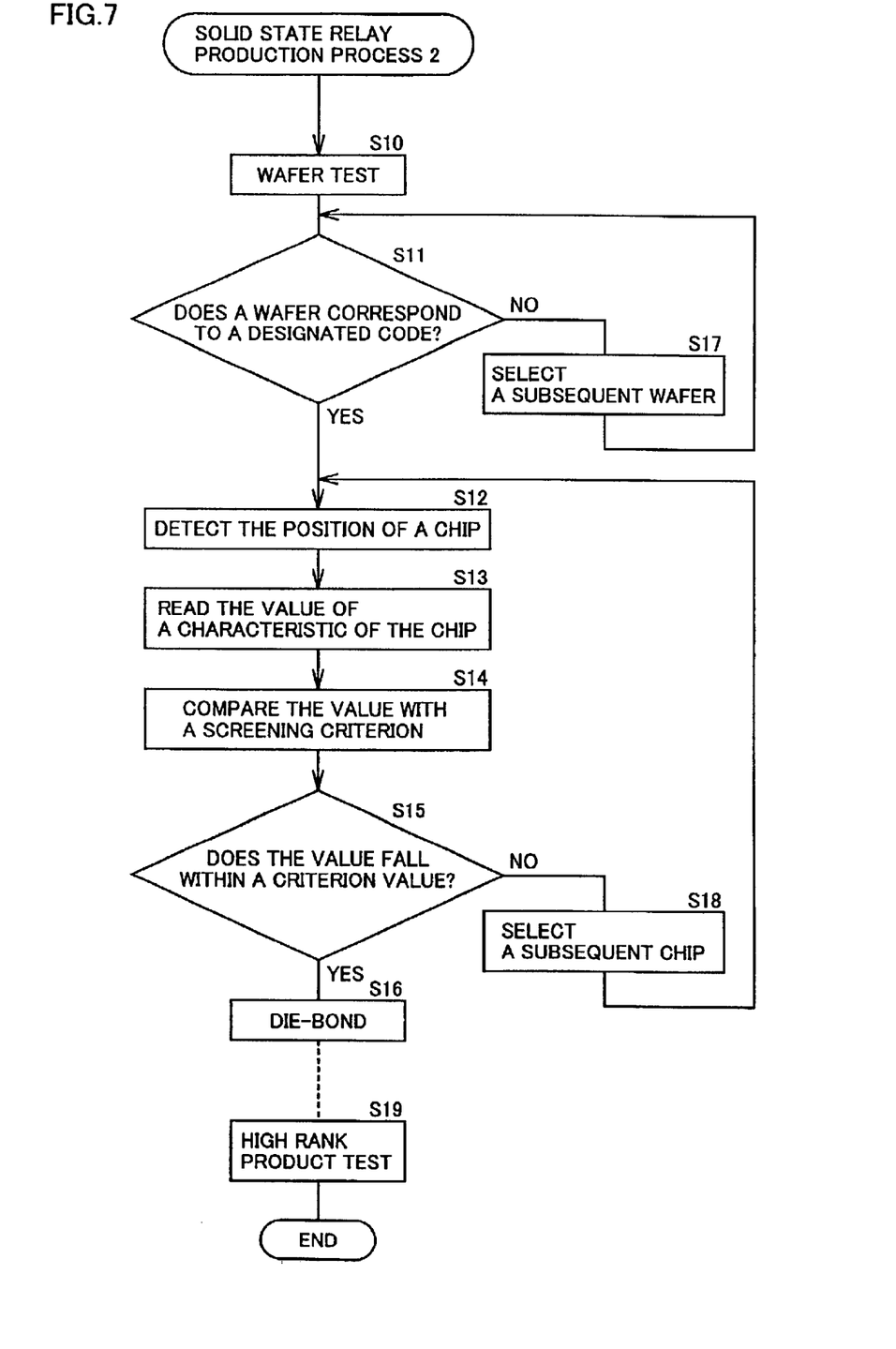

Reference will now be made to flow charts to describe production of a SSR with a wafer provided with an identification mark, as described above. FIG. 7 is a second flow chart for illustrating a solid state relay production process. With reference to the figure, a wafer is initially tested by tester 61 (S10). Die bonder 71 then performs steps S11–S18. In die bonder 71 a decision is initially made as to whether a wafer corresponds to a designated identification code (S11). The designated code referred to herein is an identification code provided to a wafer having a semiconductor chip to be die-bonded. More specifically at step S11 a wafer having a semiconductor chip to be die-bonded is selected. The chip's production number and the wafer's identification code are correlated in the S10 wafer test process and transmitted from tester 61 to die bonder 71. If the wafer does not correspond to the designated identification code then a subsequent wafer is selected (S17) and S11 is repeated.

If the wafer corresponds to the designated identification code then a chip's position on the wafer is detected (S12). The inspection data corresponding the detected position is then read from storage 73 (S13). The read inspection data is compared with a screening criterion (S14). Then a decision is made as to whether the chip's inspection data falls within the range of the screening criterion (S15).

If at step S15 the chip's inspection data does not fall within the screening criterion a subsequent semiconductor chip is selected (S18) and step S12 is again effected. If at step S15 the chip's inspection data falls within the range for the screening criterion then the ship is die-bonded to a lead frame (S16). Then a prescribed production process (not shown) is effected and thereafter a high rank product test (a finished-product test) is conducted (S19).

Solid state relays are classified into high rank products and ordinary products by noise immunity. They are classified into high rank products superior in noise immunity and ordinary products inferior in noise immunity to the high rank products. A solid state relay has noise immunity affected by the triac's sensitivity. As such, if a triac having sensitivity falling within the range of a screening criterion corresponding to a high rank product is selected from a wafer and die-bonded to a lead frame of a solid state relay, there remains in the wafer a triac chip which does not fall within the range of the screening criterion, providing a reduced yield of triac chips.

Accordingly, the triac chip remaining on the wafer is temporarily stored and after a required number of high rank products are produced the stored wafer is used for a lot for producing an ordinary solid state relay having a characteristic wider in range than the high rank product. In doing so at the die-bonding step a triac chip is selected from a wafer in accordance with the range of a screening criterion corresponding to an ordinary product having a characteristic inferior to a high rank product. A solid state relay production method can thus be provided to allow increased yields of triac chips.

Figure 8:
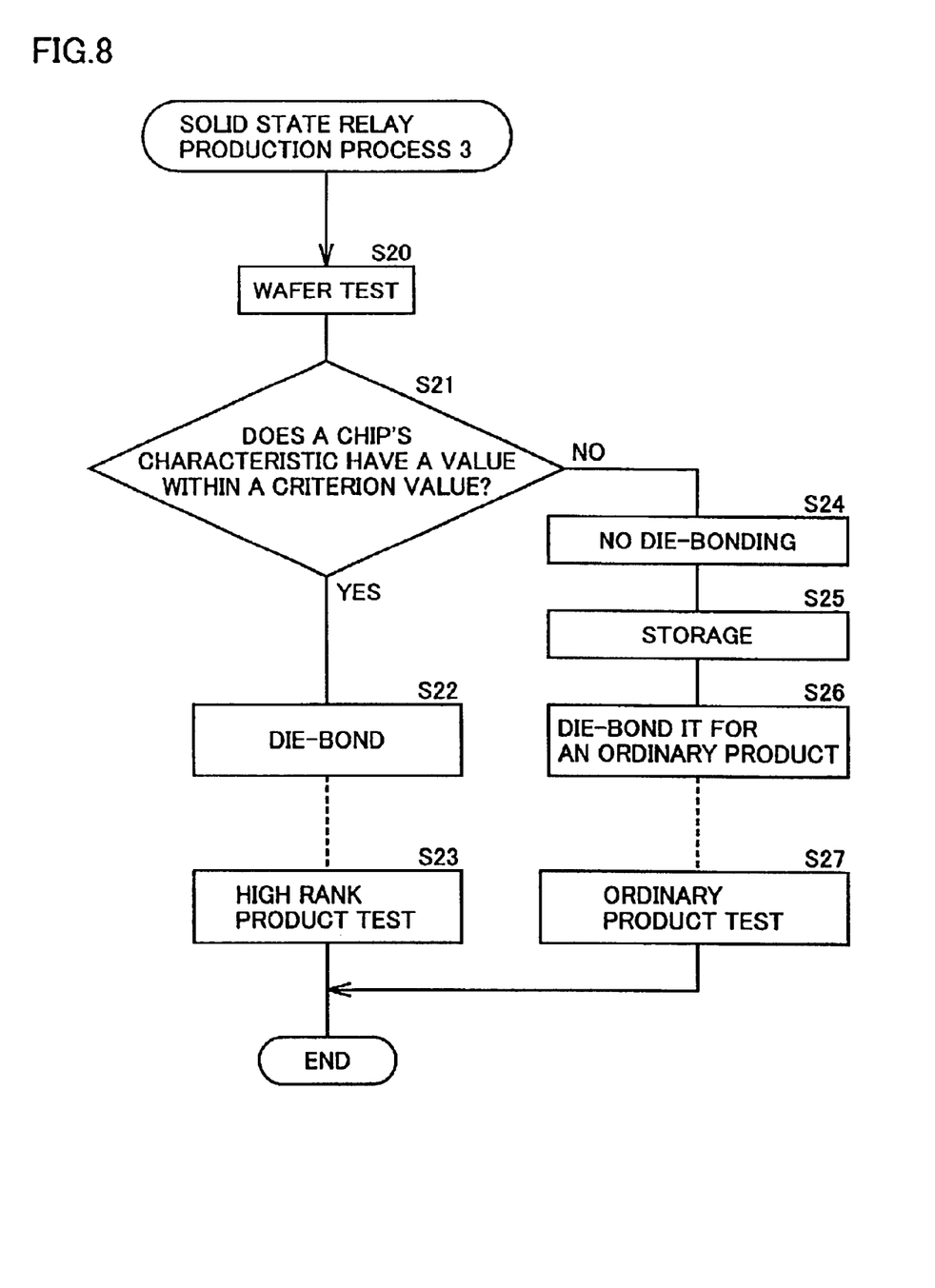

Reference will now be made to a flow chart to describe production of high rank and ordinary solid state relays using semiconductor chips formed in a single wafer. FIG. 8 is a third flow chart of a process for producing a solid state relay. With reference to the figure, tester 61 tests a wafer to measure the value of a characteristic of each chip and store it as inspection data (S20). Die bonder 71 then effects steps 21–26. Die bonder 71 determines whether the chip's inspection data falls within the range of a screening criterion (S21). This decision step is similar to the FIG. 7 steps S12–S15. If the chip's inspection data does not fall within the range of the screening criterion the chip is not die-bonded (S24). After die-bonding for high rank products ends, the remaining chips are stored (S25) for use in die-bonding for ordinary products (S26). A lead frame die-bonded as an ordinary product undergoes a prescribed production process (not shown) and then tested as an ordinary product (a finished product) (S27).

If at step S21 the chip's inspection data falls within the range of the screening criterion then the chip is die-bonded (S22). It then undergoes a prescribed production process for a high rank solid state relay and thereafter tested as a high rank product (a finished product) (S23).

Furthermore in the above embodiment if a line for die-bonding for high rank product and that for die-bonding for ordinary products are prepared and semiconductor chips to be die-bonded are screened in accordance with inspection data of semiconductor chips formed in wafers and appearance data obtained when the wafers are diced a chip to be die-bonded to a high rank lead frame and that to be die-bonded to a non-high rank lead frame can be supplied from a single wafer.

For example, a line for producing high rank SSRs having a superior characteristic and that for producing ordinary SSRs having a characteristic inferior to the high rank products are prepared. If a semiconductor chip's inspection data falls within the range of a screening criterion applied to produce the high rank product then the chip is die-bonded to a lead frame of the high rank SSR production line. If the chip's inspection data falls within a screening criterion applied to produce the ordinary product then the chip is die-bonded to a lead frame of the ordinary SSR production line. Semiconductor chips can thus be supplied from a single wafer simultaneously to a line for producing high rank semiconductor devices and that for producing ordinary semiconductor devices. This can eliminate the necessity of storing semiconductor chips that have not been used to produce high rank semiconductor devices and later using the chips to produce ordinary semiconductor devices. As a result a SSR production method providing further enhanced workability can thus be provided.

Furthermore, a semiconductor chip's inspection data and appearance test data obtained when the wafer is diced can be used to select only a semiconductor chip falling within the range of a screening criterion and die-bond the chip to a lead frame to allow the die-bonded chip's inspection data to be used in a subsequent step. For example, if inspection data of a triac chip formed in a wafer corresponds to the value of a gate trigger current, rendering a SSR's lead frame distinguishable from other lead frames allows the die-bonded chip's inspection data to be used in a subsequent step. By distinguishing the SSR lead frame, the inspection data (the value of the gate trigger current) of a solid state relay die-bonded to the lead frame can be obtained and traceability can thus be ensured.

In this case, each lead frame is provided with a frame identification code to distinguish the lead frame from other lead frames, and the inspection data of a triac chip die-bonded to the lead frame and the frame identification code are correlated and stored to storage 73. The frame identification code is represented for example by a bar code or any other similar identification mark and thus provided to a frame. Alternatively, frames may be classified and accommodated in a magazine for high rank products and that for ordinary products.

Figure 9:
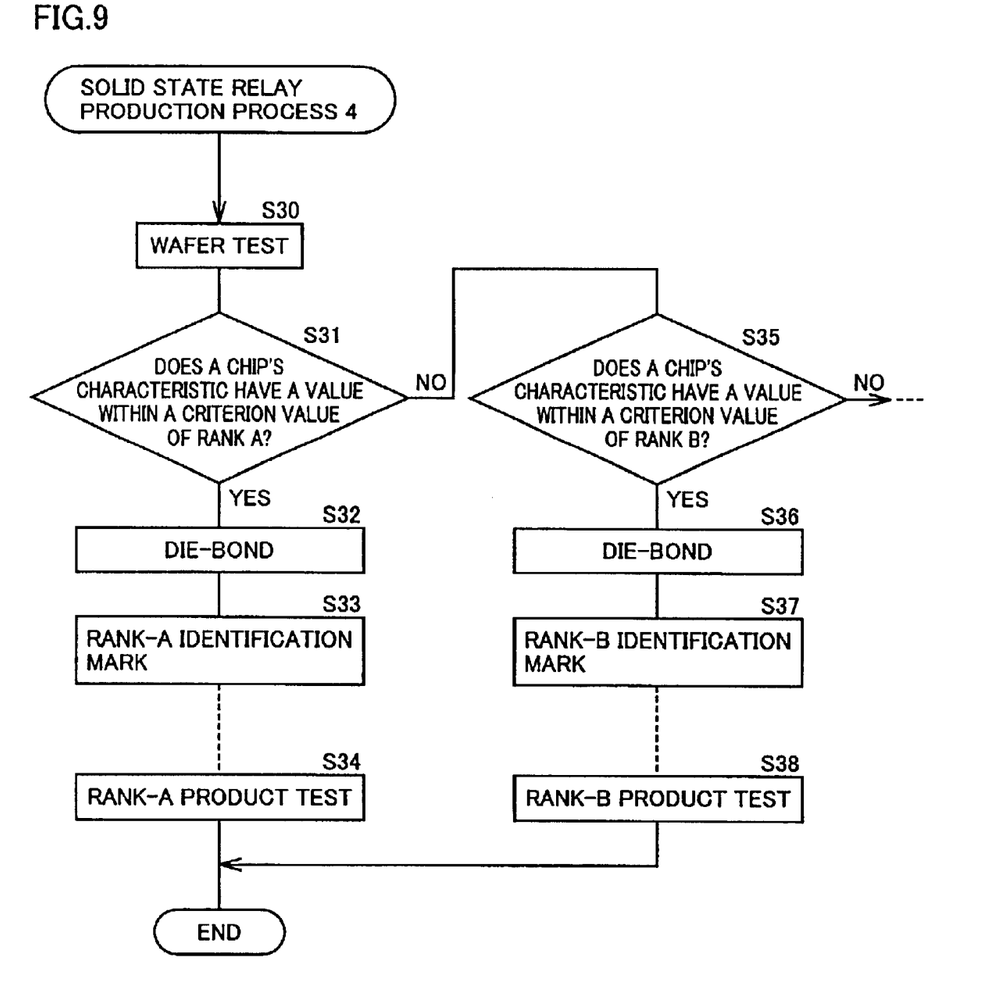

When a line for producing SSRs ranked A having high quality and that for producing SSRs ranked inferior to rank A are prepared, a single wafer supplies the lines with semiconductor chips to produce SSRs, as described hereinafter. FIG. 9 is a fourth flow chart for illustrating a solid state relay production process.

With reference to FIG. 9, tester 61 tests a wafer to obtain and store inspection data for each semiconductor chip (S30) and determines whether the chip's inspection data (or value of a characteristic) falls within the range of a screening criterion applied for producing a SSR ranked A as having best characteristic (S31). If the chip's inspection data falls within the range of the screening criterion applied for producing the SSR of rank A then the chip is die-bonded to a lead frame of a SSR of rank A (S32) and the lead frame is provided with an identification mark indicative of a SSR ranked A having a characteristic of the highest level (S33). It then undergoes a prescribed production process and then a SSR production test using a criterion for rank A (S34).

If at step S31 the chip's inspection data does not fall within the range of the screening criterion applied for producing the SSR of rank A then a decision is made as to whether the data falls within the range of a screening criterion applied to produce SSRs having a characteristic ranked B inferior to rank A (S35). If so then the chip is die-bonded to a lead frame of a SSR of rank B (S36) and the lead frame is provided with an identification mark for rank B (S37). It then undergoes a prescribed production process for producing SSRs of rank B and then tested as a SSR product in accordance with a criterion applied for SSRs of rank B (S38).

If at step S35 the chip's inspection data does not fall within the range of the screening criterion applied for producing SSRs of rank B, then, although not shown in the figure, a decision is further made as to whether the inspection data falls within the range of a screening criterion applied for producing semiconductor devices having a characteristic ranked inferior to rank B. Semiconductor devices having the characteristic ranked inferior to rank B are thus produced, as described above.

Note that the steps S31 and S35 of determining whether a triac chip's inspection data falls within the range of the screening criterion applied for producing a SSR of rank A or B are similar to the FIG. 7 steps 12–15.

Furthermore in the above production process a used semiconductor chip's inspection data and a finished SSR's product test data are correlated and stored. If a SSR's product test data is found to have a variation or the number of defective SSRs is larger than a defined value then the chip's inspection data and the SSR's product test data are fed back to the semiconductor chip production process. The fed-back semiconductor chip inspection data and SSR production test data can be used to review the range of a criterion for screening semiconductor chips to provide an increased yield thereof in subsequent production.

Note that the present invention is not limited to a SSR and it is applicable to any semiconductor device produced by die-bonding a chip formed in a wafer.

(1) As has been described above in a SSR production process of the present embodiment prior to a die-bonding step the value of a characteristic of a semiconductor chip is measured an inspection data thus obtained and the chip's position on the wafer are correlated and stored. At the die-bonding step if a wafer has no less than a prescribed number of semiconductor chips with their characteristics having a value falling within the range of a prescribed criterion the wafer is selected and semiconductor chips formed in the wafer are die-bonded. This can eliminate the necessity of marking a wafer with a bad mark. A simplified SSR production process can thus be provided.

With a wafer free of a bad mark to produce a SSR, it is no longer necessary to recognize a bad mark. This can eliminate erroneous recognition of the bad mark and thus allows the SSR to be produced efficiently.

(2) Inspection data of a semiconductor chip formed in a wafer can be stored to storage 73 of a die bonder or storage 83 of higher level computer 81 together with the chip's product number to allow the chip's inspection data to be obtained immediately by die bonder 71 so that the inspection data can be used without a time lag efficiently.

(3) If a wafer has no less than a prescribed number of semiconductor chips with their inspection data each having a value falling within the range of a prescribed screening criterion the wafer can be selected and used for die-bonding. The number of defective SSRs can be less than the prescribed number and SSRs having a prescribed characteristic can efficiently be produced.

(4) If a wafer has less than the prescribed number of semiconductor chips with their inspection data falling within the prescribed screening criterion the wafer is screened by a different screening criterion less strict than the prescribed screening criterion and die-bonded at a die-bonding step. Triac chips formed in the wafer can thus efficiently be used.

(5) A wafer can be provided with an identification mark such as a bar code representative of identification data or identification data can be stored in a chip provided to a wafer for identification to identify the wafer and hence inspection data of semiconductor chips formed in each wafer.

(6) Prior to the die-bonding step a value of a characteristic of a semiconductor chip is measured and inspection data thus obtained and the chip's position on the wafer can be correlated and stored. At the die-bonding step a semiconductor chip having a characteristic having a value falling within the range of a prescribed criterion can be selected and die-bonded. This eliminates the necessity of providing a bad mark on the wafer. Furthermore, selecting and die-bonding a semiconductor chip having a characteristic having a value falling within the range of a prescribed criterion can provide increased yields of SSRs.

(7) Semiconductor chips formed in a wafer can be screened by a criterion for producing SSRs ranked A having a characteristic with a highest value and that for producing SSRs ranked B having a characteristic inferior in value to rank A. The semiconductor chips can thus be classified into SSRs of rank A and those of rank B and supplied. Increased yields of semiconductor chips can be achieved and triac chips formed in a wafer can efficiently be used. Furthermore, if there exist a line for producing SSRs of rank A and that for producing SSRs of rank B, semiconductor chips can be supplied to the two lines. SSRs having a characteristic different in level can thus be produced simultaneously and hence efficiently.

(8) Data obtained by testing a finished SSR and data obtained by inspecting a triac chip mounted on the SSR can be correlated to allow the former data to be used to provide feedback to change the range of a criterion applied to screen triac chips to provide increased yields of SSRs subsequently produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A die bonder comprising:
   a storage storing inspection data of each of a plurality of semiconductor chips formed in a wafer and a position of each of said plurality of semiconductor chips as seen in said wafer, said inspection data being correlated with said position;
   a wafer screening portion referring to said inspection data of said semiconductor chips in said storage to screen a plurality of wafers to select a wafer; and a die-bonding portion die-bonding to a frame of a high rank semiconductor device having a characteristic of a first level a semiconductor chip formed in said wafer selected by said wafer screening portion.

2. The die bonder of claim 1, wherein said wafer screening portion selects a wafer including no less than a prescribed number of semiconductor chips having said inspection data falling within a first range.

3. The die bonder of claim 2, wherein:

said wafer screening portion screens screened-out wafers to select a wafer including no less than a prescribed number of semiconductor chips having said inspection data falling within a second range broader than said first range; and said die-bonding portion die-bonds to a frame of a semiconductor device having a characteristic of a second level inferior to said first level a semiconductor chip formed in said wafer selected in accordance with said second range.

4. The die bonder of claim 1, wherein:

said plurality of wafers includes one of an identification mark representing identification data for distinguishing a wafer from a different wafer and an identifying chip provided internal to a wafer and having said identification data stored therein; and said wafer screening portion includes a portion obtaining said identification data and a portion using said obtained identification data to identify a wafer.

5. A die bonder comprising:

a storage storing inspection data of each of a plurality of semiconductor chips formed in a wafer and a position of each of said plurality of semiconductor chips as seen in said wafer, said inspection data being correlated with said position;

a semiconductor chip screening portion referring to said inspection data of said semiconductor chips in said storage to screen a plurality of semiconductor chips to select a semiconductor chip wherein the selecting includes discriminating among chips which pass a quality threshold; and a die-bonding portion die-bonding to a frame of a semiconductor device a semiconductor chip selected by said semiconductor chip screening portion.

6. The die bonder of claim 5, wherein:

said semiconductor chip screening portion selects a semiconductor chip having said inspection data falling within a first range; and said die-bonding portion die-bonds said selected semiconductor chip to a frame of a semiconductor device having a characteristic of a first level.

7. The die bonder of claim 6, wherein:

said semiconductor chip screening portion screens screened-out semiconductor chips to select a semiconductor chip having said inspection data falling within a second range broader than said first range; and said die-bonding portion die-bonds to a frame of a semiconductor device having a characteristic of a second level inferior to said first level a semiconductor chip having said inspection data falling within said second range.

8. The die bonder of claim 7, wherein said die-bonding portion is provided to a line producing a semiconductor device having said characteristic of said first level and a semiconductor device having said characteristic of said second level.

9. The die bonder of claim 5, wherein said storage correlates and stores a frame identification code provided for identifying the frame of said semiconductor device and inspection data of a semiconductor chip die-bonded to said semiconductor device.

10. A method of producing a semiconductor device, comprising the steps of:

inspecting each of a plurality of semiconductor chips formed in a wafer;

correlating and storing inspection data obtained at the step of inspecting and a position of each of said semiconductor chips as seen on said wafer;

screening said semiconductor chips in accordance with said stored inspection data of said semiconductor chips to select a semiconductor chip wherein the selecting includes discriminating among chips which pass a quality threshold; and die-bonding said selected semiconductor chip to a frame of a semiconductor device.

11. The method of claim 10, wherein:

the screening step includes selecting a semiconductor chip having said inspection data falling within a first range; and the die-bonding step includes die-bonding said selected semiconductor chip to a frame of a semiconductor device having a characteristic of a first level.

12. The method of claim 10, further comprising the steps of:

screening semiconductor chips screened out at the screening step, to select a semiconductor chip having said inspection data falling within a second range broader than said first range; and die-bonding said semiconductor chip having said inspection data falling within said second range to a frame of a semiconductor device having a characteristic of a second level inferior to said first level.

13. The method of claim 10, further comprising the step of correlating and storing a frame identification code provided for identifying a frame of said semiconductor device and inspection data of a semiconductor chip die-bonded to said semiconductor device.

14. The method of claim 13, further comprising the steps of:

inspecting said semiconductor device; and feeding back to the screening step said inspection data of said semiconductor device, said frame identification code of the frame of said semiconductor device, and said inspection data of a semiconductor chip correlated with said frame identification code.

15. The method of claim 14, wherein the feeding back step includes the step of changing a reference for screening said semiconductor chips in accordance with said inspection data of said semiconductor device and said inspection data of said semiconductor chip fed back.

16. The method of claim 10, wherein the storing step includes correlating said inspection data with a position of each said semiconductor chip, as seen on said wafer, for storing to a storage provided to one of a die bonder or a computer connected to said die bonder through a network.

* * * * *